(12) United States Patent
Ferguson et al.

(10) Patent No.: US 6,940,408 B2
(45) Date of Patent: Sep. 6, 2005

(54) RFID DEVICE AND METHOD OF FORMING

(75) Inventors: Scott Wayne Ferguson, Arcadia, CA (US); David N. Edwards, Arcadia, CA (US)

(73) Assignee: Avery Dennison Corporation, Pasadena, CA (US)

(*) Notice: Subject to any disclaimer, the term of this patent is extended or adjusted under 35 U.S.C. 154(b) by 97 days.

(21) Appl. No.: 10/334,290

(22) Filed: Dec. 31, 2002

(65) Prior Publication Data
US 2004/0125040 A1 Jul. 1, 2004

(51) Int. Cl.$^7$ .............................................. G08B 13/14

(52) U.S. Cl. .................... 340/572.7; 340/572; 343/873; 343/895; 257/673

(58) Field of Search ............................ 340/572, 572.7; 257/673, 674; 343/872, 873, 700 MS, 895

(56) References Cited

U.S. PATENT DOCUMENTS

| | | | | |
|---|---|---|---|---|
| 4,783,646 A | * | 11/1988 | Matsuzaki ............... | 340/572.5 |
| 4,898,323 A | | 2/1990 | Chen et al. | |
| 5,153,983 A | | 10/1992 | Oyama | |
| 5,528,222 A | * | 6/1996 | Moskowitz et al. ..... | 340/572.7 |
| 5,545,291 A | | 8/1996 | Smith et al. | |
| 5,564,888 A | | 10/1996 | Doan | |
| 5,781,110 A | | 7/1998 | Habeger, Jr. et al. .... | 346/572.5 |
| 5,783,856 A | | 7/1998 | Smith et al. | |
| 5,786,626 A | * | 7/1998 | Brady et al. ................ | 257/673 |
| 5,824,186 A | | 10/1998 | Smith et al. | |
| 5,904,545 A | | 5/1999 | Smith et al. | |
| 6,100,804 A | | 8/2000 | Brady et al. ............. | 340/572.7 |
| 6,107,920 A | | 8/2000 | Eberhardt et al. | |
| 6,121,880 A | | 9/2000 | Scott et al. ............... | 346/572.5 |
| 6,145,901 A | | 11/2000 | Rich ......................... | 294/64.1 |

(Continued)

FOREIGN PATENT DOCUMENTS

| | | |
|---|---|---|
| DE | 101 20 269 C1 | 4/2001 |
| EP | 1 039 543 | 9/2000 |
| JP | 2002308437 | 10/2002 |
| JP | 2003223626 | 8/2003 |
| JP | 2003242471 | 8/2003 |
| WO | 82/00541 | 2/1982 |
| WO | 00/46854 | 8/2000 |
| WO | 00/49421 | 8/2000 |
| WO | 00/49658 | 8/2000 |
| WO | 00/55915 | 9/2000 |
| WO | 00/55916 | 9/2000 |
| WO | 01/33621 | 5/2001 |
| WO | 01/71686 | 9/2001 |
| WO | 01/75832 | 10/2001 |
| WO | 02/25825 | 3/2002 |
| WO | 02/35289 | 5/2002 |
| WO | 02/097723 | 12/2002 |
| WO | 03/056509 | 7/2003 |
| WO | 03/068874 | 8/2003 |
| WO | 2004/017439 | 2/2004 |
| WO | 2004/044834 | 5/2004 |
| WO | 2004/046762 | 6/2004 |

OTHER PUBLICATIONS

Wernle, Michael E. Dr., *Manufacturing of Low Cost Smart Labels,* NanoPierce Card Technologies GmbH, presented at IMAPS, Boston Massachusetts, Sep. 2000.

*Primary Examiner*—Tho Phan
(74) *Attorney, Agent, or Firm*—Renner, Otto, Boisselle & Sklar, LLP (57) ABSTRACT

A radio frequency identification (RFID) inlay includes a conductive connection electrically connecting an antenna to strap leads that are coupled to an RFID chip. The conductive connection may include conductive bumps attached to the strap, and/or may include conductive traces, such as a conductive ink traces. The conductive connections provide a convenient, fast, and effective way to operatively couple antennas and straps. The RFID inlay may be part of an RFID label or RFID tag.

83 Claims, 4 Drawing Sheets

U.S. PATENT DOCUMENTS

| | | |
|---|---|---|
| 6,181,287 B1 | 1/2001 | Beigel .................. 343/741 |
| 6,206,292 B1 | 3/2001 | Robertz et al. |
| 6,246,327 B1 * | 6/2001 | Eberhardt ............. 340/572.1 |
| 6,259,408 B1 | 7/2001 | Brady et al. |
| 6,262,292 B1 | 7/2001 | Yasuda et al. |
| 6,274,508 B1 | 8/2001 | Jacobsen et al. |
| 6,281,038 B1 | 8/2001 | Jacobsen et al. |
| 6,451,154 B1 | 9/2002 | Grabau et al. |
| 6,624,362 B2 | 9/2003 | Müller ................... 174/261 |
| 6,630,203 B2 | 10/2003 | Bahn et al. ............. 427/304 |
| 6,665,193 B1 * | 12/2003 | Chung et al. ........... 361/760 |
| 6,683,254 B1 | 1/2004 | Gunnels ................ 174/84 R |
| 6,796,508 B2 | 9/2004 | Müller ................... 235/492 |
| 2001/0053675 A1 | 12/2001 | Plettner ................... 455/91 |
| 2002/0027294 A1 | 3/2002 | Newhaus et al. ......... 257/778 |
| 2004/0041262 A1 | 3/2004 | Okamoto et al. ......... 257/737 |

\* cited by examiner

RFID DEVICE AND METHOD OF FORMING

BACKGROUND OF THE INVENTION

1. Field of the Invention

This invention relates to the field of radio frequency identification (RFID) tags and labels, and to particular configuration of such devices and methods of manufacturing such devices.

2. Description of the Related Art

RFID tags and labels have a combination of antennas and analog and/or digital electronics, which may include for example communications electronics, data memory, and control logic. RFID tags and labels are widely used to associate an object with an identification code. For example, RFID tags are used in conjunction with security-locks in cars, for access control to buildings, and for tracking inventory and parcels. Some examples of RFID tags and labels appear in U.S. Pat. Nos. 6,107,920, 6,206,292, and 6,262,292, all of which this application incorporates by reference.

RFID tags and labels include active tags, which include a power source, and passive tags and labels, which do not. In the case of passive tags, in order to retrieve the information from the chip, a "base station" or "reader" sends an excitation signal to the RFID tag or label. The excitation signal energizes the tag or label, and the RFID circuitry transmits the stored information back to the reader. The "reader" receives and decodes the information from the RFID tag. In general, RFID tags can retain and transmit enough information to uniquely identify individuals, packages, inventory and the like. RFID tags and labels also can be characterized as to those to which information is written only once (although the information may be read repeatedly), and those to which information may be written during use. For example, RFID tags may store environmental data (that may be detected by an associated sensor), logistical histories, state data, etc.

Methods for manufacturing RFID labels are disclosed in U.S. Pat. No. 6,451,154, assigned to Moore North America, Inc., which is incorporated herein by reference in its entirety. The method disclosed in U.S. Pat. No. 6,451,154 uses a number of different sources of RFID inlets, each inlet including an antenna and a chip. A plurality of webs are matched together and RFID labels are die cut from the webs, to produce RFID labels with liners. Alternatively, linerless RFID labels are produced from a composite web with a release material on one face and pressure sensitive adhesive on the other, the labels formed by perforations in the web. Various alternatives are possible.

Still other RFID devices and methods for manufacturing RFID labels are disclosed in U.S. patent application Publication No. US2001/0053675 by Plettner, which is incorporated herein by reference in its entirety. The devices include a transponder comprising a chip having contact pads and at least two coupling elements, which are conductively connected with the contact pads. The coupling elements are touch-free relative to each other and formed in a self-supported as well as a free-standing way and are essentially extended parallel to the chip plane. The total mounting height of the transponder corresponds essentially to the mounting height of the chip. The size and geometry of the coupling elements are adapted for acting as a dipole antenna or in conjunction with an evaluation unit as a plate capacitor. Typically, the transponders are produced at the wafer level. The coupling elements can be contacted with the contact pads of the chip directly at the wafer level, i.e., before the chips are extracted from the grouping given by the wafer.

In many applications, it is desirable to reduce the size of the electronics as small as possible. Applicants' assignee Avery Dennison Corporation has been working with Alien Technology Corporation and others to identify materials, devise constructions, and develop processing techniques to efficiently produce rolls of a flexible substrate filled with "small electronic blocks".

Figure 1:
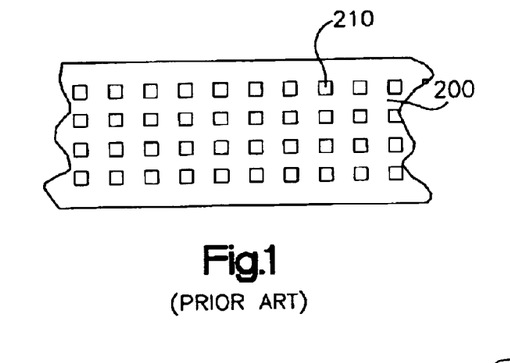
FIG. 1 illustrates a pattern of embossed wells on the surface of a portion of a web, into which small electronic blocks of complementary shape may be embedded.

Considering the flexible substrate filled with "small electronic blocks," Alien Technology Corporation ("Alien"), of Morgan Hill, Calif., for example, has developed techniques for manufacturing microelectronic elements as small electronic blocks, which Alien calls "NanoBlocks", and then depositing the small electronic blocks into recesses on an underlying substrate. To receive the small electronic blocks, a planar substrate 200 (FIG. 1) is embossed with numerous receptor wells 210. The receptor wells 210 are typically formed in a pattern on the substrate. For instance, in FIG. 1 the receptor wells 210 form a simple matrix pattern that may extend over only a predefined portion of the substrate, or may extend across substantially the entire width and length of the substrate, as desired.

Figure 2:
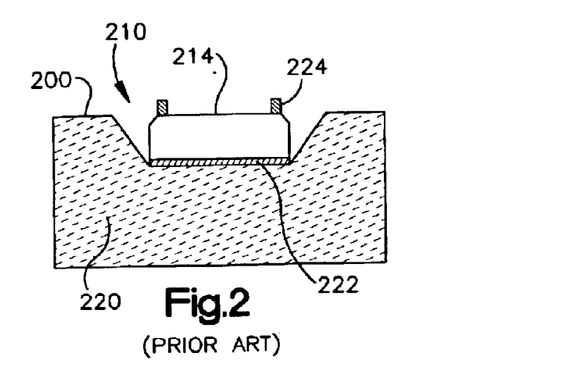
FIG. 2 illustrates a small electronic block embedded in a well in a section cut out from an embossed substrate.

To place the small electronic blocks into the recesses, Alien uses a technique known as Fluidic Self Assembly ("FSA"). The FSA method includes dispersing the small electronic blocks in a slurry, and then flowing the slurry over the top surface of the substrate. The small electronic blocks and recesses have complementary shapes, and gravity pulls the small electronic blocks down into the recesses. The end result is a substrate (e.g., a sheet, a web, or a plate) that is embedded with tiny electronic elements. FIG. 2 illustrates a small electronic block 214 disposed within a recess 210. Between the block 214 and the substrate 220 is a metallization layer 222. The block 100 has a top surface with a circuit 224 disposed thereon.

Alien has a number of patents on its technique, including U.S. Pat. Nos. 5,783,856; 5,824,186; 5,904,545; 5,545,291; 6,274,508; and 6,281,038, all of which the present application incorporates by reference. Further information can be found in Alien's Patent Cooperation Treaty publications, including WO 00/49421; WO 00/49658; WO 00/55915; WO 00/55916; WO 00/46854 and WO 01/33621, all of which this application incorporates by reference in their entireties. Another recent publication of interest appeared in the Information Display, November 2000, Vol. 16, No. 11 at pp. 12–17, and in a paper published by the MIT Auto-ID Center, entitled, "Toward the 5 Cent Tag," published in February 2002. Further details regarding the manufacture of the microstructure elements and the FSA processes may be found in U.S. Pat. Nos. 5,545,291 and 5,904,545, and in PCT Publication No. WO 00/46854, the entire disclosures of which are hereby incorporated by reference.

As set forth in the MIT Auto-ID Center publication cited above, the electronic blocks may be located in the openings by a vibratory feeder assembly, such as that developed by Philips, instead of the Fluidic Self-Assembly method. Alternatively, the electronic blocks may be located into the openings with a deterministic pick-and-place method, which can use a robot arm to pick the electronic elements and place them one at a time into respective openings, as described in U.S. Pat. No. 6,274,508.

In yet another approach to locating the electronic blocks, the webstock or sheetstock may include openings that extend through the entire thickness of the sheet. A vacuum may be applied below the webstock to pull the electronic blocks into and to fill the openings.

One problem with current assembly methods is that methods of attaching the electronics to the antenna may be slow and/or difficult due to accuracy requirements for placing the electronics, especially small electronics, on the antenna. Also, difficulties in assembly may arise from long cure times and/or expensive materials used in adhesives for attaching the electronics to the antenna.

From the foregoing it will be seen that room exists for improvements in RFID tags and methods of assembling such tags.

SUMMARY OF THE INVENTION

According to an aspect of the invention, an RFID inlay includes conductive bumps that electrically couple strap leads to an antenna.

According to another aspect of the invention, an RFID inlay includes conductive traces that electrically couple strap leads to an antenna.

According to yet another aspect of the invention, a method of making an RFID inlay includes placing a strap on an inlay substrate such that conductive bumps on the strap are in contact with an antenna on the substrate, and attaching the strap to the antenna and inlay substrate. According to a specific embodiment of the invention, the attaching may include curing an adhesive on the conductive bumps.

According to still another aspect of the invention, a method of making an RFID inlay includes attaching a strap to an antenna and an inlay substrate that the antenna is on, and depositing conductive traces to electrically couple the antenna to strap leads of the strap.

According to an aspect of the invention, an RFID inlay includes an inlay substrate; an antenna on the inlay substrate; a strap, which in turn includes an RFID chip having contacts thereupon, and strap leads operatively coupled to the contacts of the chip; a nonconductive adhesive attaching the strap to the inlay substrate; and a conductive connection operatively coupling the strap leads and the antenna.

According to another aspect of the invention, an RFID inlay includes an inlay substrate; an antenna on the inlay substrate; a strap attached to the antenna and the inlay substrate, wherein the strap includes: an RFID chip having contacts thereupon, and strap leads operatively coupled to the contacts of the chip; and conductive bumps attached to the strap and in contact with the antenna. The conductive bumps electrically couple the strap leads and the antenna.

According to yet another aspect of the invention, an RFID inlay includes an inlay substrate; an antenna on the inlay substrate; a strap attached to the antenna and the substrate, wherein the strap includes: an RFID chip having contacts thereupon, and strap leads operatively coupled to the contacts of the chip; and conductive traces overlying and in contact with both the antenna and the strap leads.

According to still another aspect of the invention, a method of forming an RFID inlay includes forming conductive bumps on straps leads operatively coupled to an RFID chip; and bringing the conductive bumps and an antenna on an inlay substrate into contact, thereby electrically coupling the RFID chip and the antenna.

According to a further aspect of the invention, a method of forming an RFID inlay includes placing a strap on an antenna that is on an inlay substrate; and placing conductive traces over at least parts of the strap and the antenna, thereby electrically coupling the strap and the antenna.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

RFID Inlays

By way of overview, the present invention involves structures and method for operatively coupling parts of an RIFD inlay together. Specifically, the invention relates to conductive connections between an RFID antenna and a strap that is in turn operatively coupled to a chip, such as an integrated circuit chip. The conductive connection may include conductive bumps attached to the strap, and/or may include conductive traces, such as a conductive ink traces. The conductive connections provide a convenient, fast, and effective way to operatively couple antennas and straps.

Figure 3:
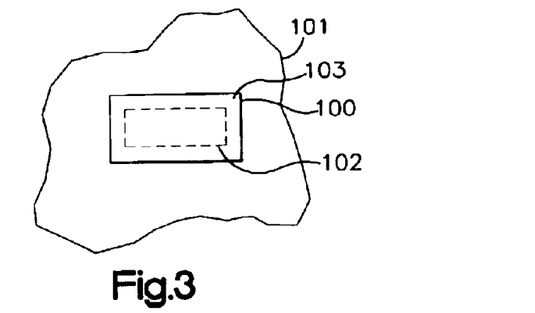
FIG. 3 illustrates an RFID tag or label adhered to an object.

Referring initially to FIG. 3, an RFID tag or label 100 is adhered or otherwise coupled to an object 101. The RFID tag or label 100 includes an RFID inlay 102 and a printable facestock 103. The RIFD inlay 102 as used herein may include a variety of active and passive RFID devices.

Figure 4:
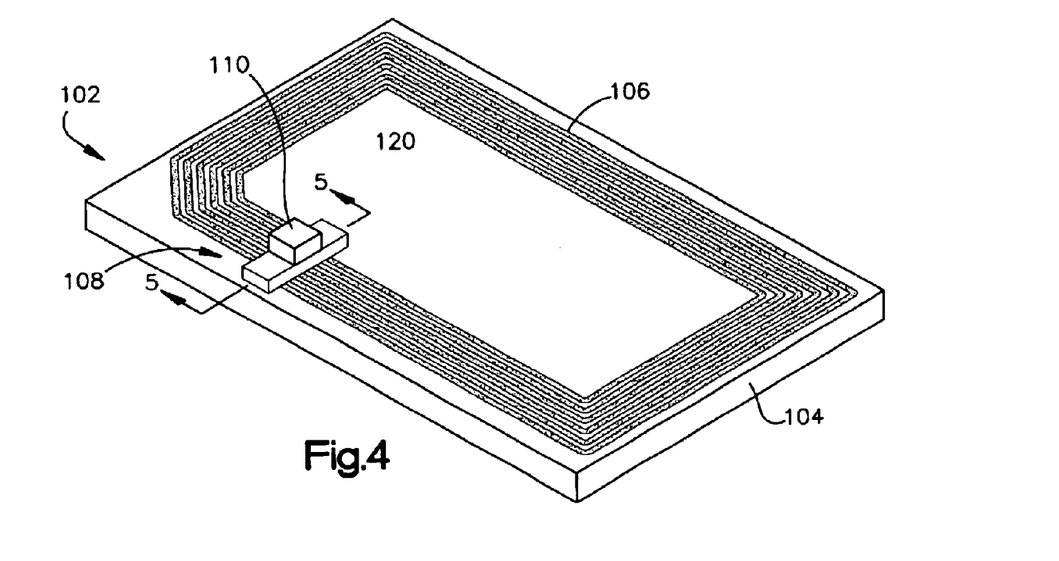
FIG. 4 is an isometric projection of an RFID inlay in accordance with the present invention.
Figure 5:
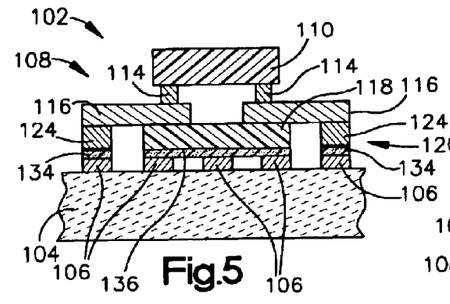
FIG. 5 is a side sectional view, along section 5—5 of FIG. 4.
Figure 6:
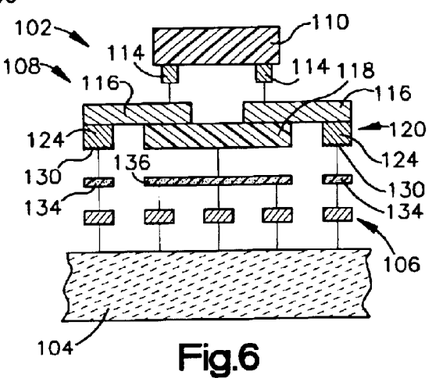
FIG. 6 is an exploded view of the RFID inlay of FIG. 5.

Referring now and in addition to FIGS. 4–6, further details of the RFID inlay 102 are shown. The RFID inlay 102 includes an inlay substrate 104, with an antenna 106 thereupon. The inlay substrate 104 may be any of a variety of suitable materials. The suitable materials for the inlay substrate 104 may include materials that are flexible, and are suitable for use in roll-to-roll processes. The inlay substrate 104 may be a piece of material that has been separated from a webstock or sheetstock.

Examples of suitable materials for the inlay substrate 104 include, but are not limited to, high Tg polycarbonate, poly(ethylene terephthalate), polyarylate, polysulfone, a norbornene copolymer, poly phenylsulfone, polyetherimide, polyethylenenaphthalate (PEN), polyethersulfone (PES), polycarbonate (PC), a phenolic resin, polyester, polyimide, polyetherester, polyetheramide, cellulose acetate, aliphatic polyurethanes, polyacrylonitrile, polytrifluoroethylenes, polyvinylidene fluorides, HDPEs, poly(methyl methacrylates), a cyclic or acyclic polyolefin, or paper.

The antenna 106 may be an antenna in any of a variety of suitable configurations. The antenna 106 may be made of a conductive material, such as a metallic material. (The terms "conductive" and "nonconductive," as used herein, refer to electrical conductivity.) The antenna 106 may be formed on the inlay substrate 104 by any of a variety of methods. For example, the antenna 106 may be formed from a conductive ink that is printed or otherwise deposited on the inlay substrate 104. Alternatively, the antenna 106 may be formed from metal deposited on the inlay substrate 104 by any of a variety of suitable, known deposition methods, such as vapor deposition. As a further alternative, the antenna 106 may be part of a web of antenna material that is adhered to the substrate 104 by suitable means, for example, by use of a suitable adhesive in a lamination process. The web of a plurality of antennas made from, for example, copper, silver, aluminum or other thin conductive material (such as etched or hot-stamped metal foil, conductive ink, sputtered metal, etc.). The web of antennas may be on a film, coated paper, laminations of film and paper, or other suitable substrate. As yet another alternative, the antenna 104 may be formed by selective removal of metal from a metal layer, for example, using known lithography processes. It will be appreciated that other suitable means, for example, electroplating, may be used to form the antenna 106 on the inlay substrate 104.

The antenna 106 is described herein as being "on" the inlay substrate 104. It is intended that this description include configurations where the antenna 106 may be wholly or partly within the inlay substrate 104.

The RFID inlay 102 also includes a strap 108 operatively coupled to the antenna 106. The strap 108 includes a chip 110 having chip contacts 114 that are operatively coupled to strap leads 116. The chip 110 may be referred to herein in addition as an "electronic element." The chip 110 may be any of a variety of suitable electronic components for suitably interacting with the antenna 106, for example to receive and/or to send signals.

The strap leads 116 may be completely made out of an electrically conducting material, such as being made out of a metal foil. Alternatively, the strap leads 116 may include an electrically insulating material, for example being plastic coated with metal. The strap 108 may include a strap substrate 118, which is attached the strap leads 116. The strap substrate 118 may prevent electrical contact between the strap leads 116 and the antenna 104, and/or may be used to mechanically support the strap leads 116. The strap substrate 118 may be made of any of a variety of suitable materials, for example, suitable flexible polymeric materials.

It will be appreciated that a variety of strap configurations are available for coupling to the antenna 106. Examples include an RFID strap available from Alien Technologies, and the strap marketed under the name I-CONNECT, available from Philips Electronics. The strap substrate 118 may be a material such as PET, polypropylene or other polyolefins, polycarbonate, or polysulfone.

The strap leads 116 are operatively coupled to the antenna 106 via an electrically-conductive connection 120. As shown in FIGS. 5 and 6, the conductive connection 120 may include electrically conductive bumps 124 on the straps leads 116. Alternatively, or in addition, the conductive connection 120 may include conductive traces, such as conductive ink traces, coupling the straps leads and the antenna 106. Such conductive traces are described below with regard to other embodiments.

The conductive bumps 124 facilitate operative connection of the strap 112 to the antenna 106 and/or the inlay substrate 104. The conductive bumps 124 are used in electrically coupling the strap leads 116 to the antenna 106.

The conductive bumps 124 may be any of a variety of electrically conductive materials, such as suitable metals. Examples of metals used in making conductive bumps are gold, nickel, and palladium. In addition, the conductive bumps 124 may include a multitude of small, hard particles, providing a multitude of sharp points for penetrating the mating contact surface (the antenna 106). An example of suitable small, hard particles are diamond particles, such as in diamond dust.

In an exemplary process, the conductive bumps 124 may be formed by depositing the hard particles onto surfaces of the strap leads 116. For example, a nickel electroplating process may be used to deposit the hard particles. In the electroplating process the hard particles and the contact surface are encapsulated in the nickel. If necessary, a photoresist may be used as a mask, using standard lithographic means, for masking portions of the strap 112 during the electroplating to form the conductive bumps 124. The nickel may then be overplated with another material, such as gold, for example, to provide a corrosion-resistant surface. The presence of the hard particles makes for conductive bumps 124 that have a large number of sharp points 130 extending out of the surface of the conductive bumps 124. When brought into contact with the antenna 106 the sharp points penetrate into the material of the antenna, and/or penetrate an oxide film, such as an aluminum or copper oxide film, coating the surface of the antenna 106. Thus an electrical connection between the strap leads 116 and the antenna 106 is accomplished.

The sharp points 130 may even be capable of extending through a bump-antenna adhesive 134 between the conductive bumps 124 and then antenna 106. The bump-antenna adhesive 134 may be a nonconductive adhesive, an isotropic electrically-conductive adhesive or an anisotropic electrically-conductive adhesive. The bump-antenna adhesive 134 may be a UV-cured adhesive or a heat-curable adhesive. The conductive bumps 124 may each have a height from about 5 to 25 microns (about 0.0002 to 0.001 inches). The strap substrate 118 may have a thickness of from about 0.0005 inches to about 0.007 inches.

Formation of conductive bumps 124 such as those described above may be accomplished, for example, by use of WAFERPIERCE technology marketed by NanoPierce Technologies, Inc., of Denver, Colo. Such technology is described in greater detail in PCT Publication WO 02/25825, which is incorporated herein by reference in its entirety.

As noted earlier, it will be appreciated that the strap leads 116 may include a dielectric material with conductive layers on one or both sides. For such strap leads, conductive-material-filled holes in the dielectric material may be utilized in order to operatively couple the chip contacts 114 and the conductive bumps 124.

As shown in FIG. 6, the strap 112 may be attached to the antenna 106 and/or the inlay substrate 104 via the bump-antenna adhesive 134 and/or via a strap-substrate adhesive 136. As noted above, the bump-antenna adhesive 134 may be a conductive adhesive or may be a non-conductive adhesive, such as PSA or epoxy adhesives. The strap-substrate adhesive 136 may be a non-conductive adhesive, to prevent undesired electrical connection between various parts of the antenna 106.

Figure 7:
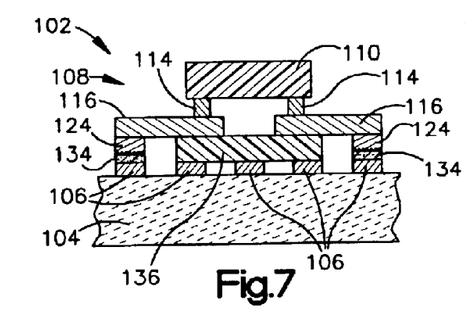
FIG. 7 is a side sectional view of an alternate embodiment RFID.

Further, as noted above and as shown in FIG. 7, the strap substrate 118 may be omitted. In such a configuration a non-conductive strap-substrate adhesive 134 may also prevent undesired contact between the antenna 106 and un-bumped parts of the strap leads 116.

Figure 8:
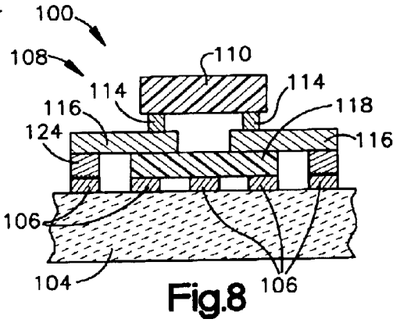
FIG. 8 is a side sectional view of another alternate embodiment RFID.

As another alternative, as shown in FIG. 8, both of the adhesives 134 and 136 may be omitted, with the conductive bumps 124 non-adhesively secured to the antenna 106. For example, the conductive bumps 124 may be welded to the antenna 106, such as by laser welding or ultrasonic welding.

Figure 9:
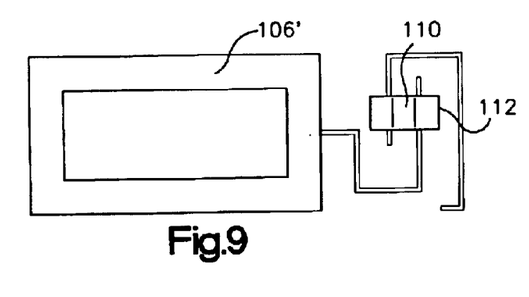
FIGS. 9 and 10 are plan views showing an RFID strap attached to alternative antenna configurations.
Figure 10:
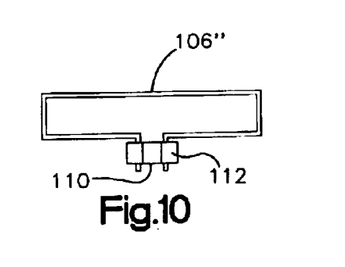

It will be appreciated that the antenna 106 illustrated in the figures is only one example of the wide variety of antenna configurations that the chip 110 and the strap 112 may be coupled to. Connection of the chip 110 and the strap 112 to alternative antenna configurations 106' and 106" is illustrated in the FIGS. 9 and 10, respectively.

By using the strap leads 116, instead of directly connecting the chip contacts 114 to the antenna 106, tolerances for placement may be larger, due to the straps 116 having a larger surface for connection, and thus, more of a tolerance for errors in placement than the chip contacts 114. Further, the conductive bumps 124 provide advantages when compared to prior methods of joining the strap leads 116 directly to the antenna 106. Using the conductive bumps 124 may allow a reduction in the time required for curing the adhesive coupling the strap to the antenna. This is because using the conductive bumps allows use of a non-conductive adhesive as the bump-antenna adhesive 134, and non-conductive adhesives may have shorter curing times when compared with conductive adhesives. In addition, compared with conductive adhesives, non-conductive adhesives may be easier to work with, may have longer shelf life, and may be less expensive. By use of the conductive bumps 124, the time for curing the adhesive 134 may be reduced to under 2 seconds, which may be compared with the over 20 seconds required to couple strap leads to an antenna using the prior art processes. In addition, curing of the bump-antenna adhesive 134 may be accomplished without applying pressure, for example, by using ultraviolet curing.

Further, the sharp points 130 on the conductive bumps 124 allow a better connection to be made with the antenna 106, albeit with less force, when compared to the smooth undersides of the strap leads 116. The sharp points 130 serve to concentrate any downward force of the strap 112 against the antenna 106 and/or the inlay substrate 104, thus facilitating a good electrical connection between the conductive bumps 124 and the antenna 106.

Figure 11:
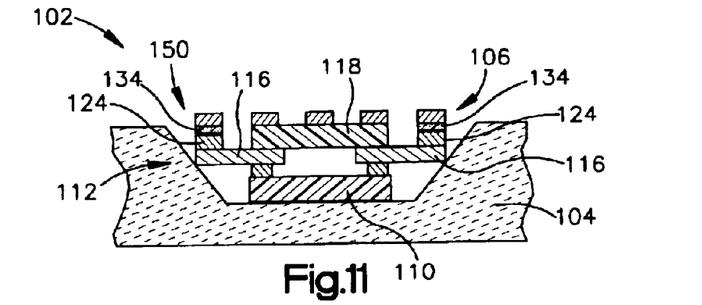
FIG. 11 is a side sectional view of yet another alternate embodiment RFID inlay.

FIG. 11 shows an alternate configuration, wherein the strap 112 and its chip 110 are located within a depression 150 in the inlay substrate 104. The strap 112 may be placed in the depression 150 using fluidic self-assembly or other suitable processes. After placement of the strap 112 in the depression 150, the antenna 106 is then formed or placed on the inlay substrate 104 in contact with the conductive bumps 124.

Figures 12, 13, 14:
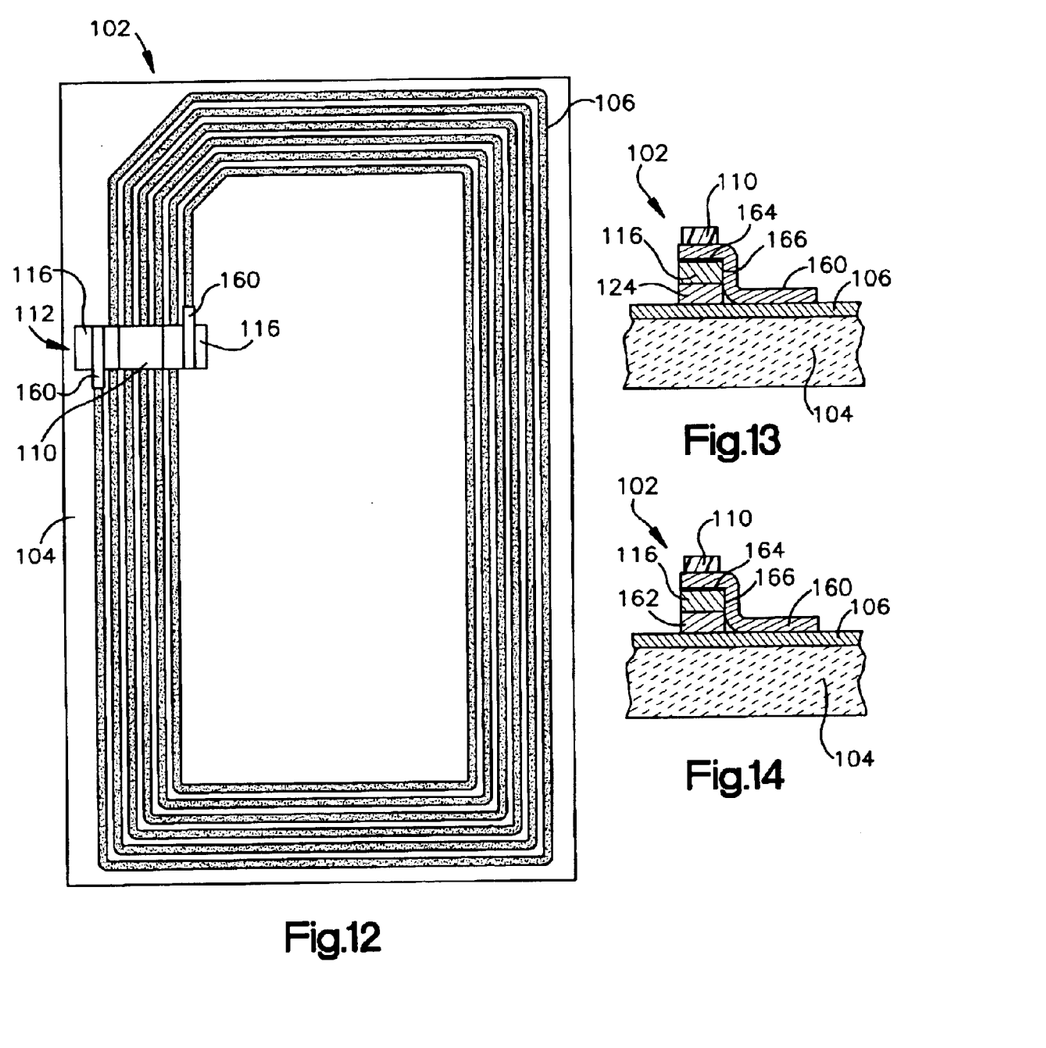
FIG. 12 is a top view of another alternate embodiment RFID inlay.
FIG. 13 is an end view of one particular embodiment of the RFID inlay of FIG. 10.
FIG. 14 is an end view of another particular embodiment of the RFID inlay of FIG. 10.

FIGS. 12–14 show other embodiments of the RFID inlay 102. The embodiments shown in FIGS. 12–14 all include conductive traces 160 that electrically couple the strap leads 116 to the antenna 106, either as an alternative to or in addition to connection via bumps on the strap leads 116. FIG. 12 shows a generalized configuration of an RFID inlay 102 having conductive traces 160, while FIGS. 13 and 14 show specific embodiments of such an inlay. FIG. 13 shows the conductive trace 160 making a connection between the antenna 106 and the strap lead 116 in addition to connection via the conductive bump 124. FIG. 14 shows the conductive trace 160 as being an alternative means of coupling the strap leads 116 and the antenna 106. In the configuration in FIG. 14 a non-conductive adhesive 162, for example, PSA, is utilized between the strap leads 116 and the antenna 106. It will be appreciated that the non-conductive adhesive 162 is representative of a larger category of couplings between the strap 116 and the antenna 106. For example, attachment between the strap 116 and the antenna 106 may be accomplished by thermal plastic welding, or by ultrasonic welding.

The conductive traces 160 may be formed by printing a conductive ink such as a silver ink, dispensed as a conductive epoxy, in areas where desired. Alternatively, the conductive traces may include a conductive adhesive.

As may be seen in FIGS. 13 and 14, the conductive traces 160 may be in contact with both a top surface 164 and a side surface 166 of the strap lead 116. Alternatively, the conductive traces 160 may be in contact with only one of the surfaces 164 and 166.

It will be appreciated that the RFID tag or label 100 other layers besides the inlay 102, such as a web or sheet of selected materials used to support and protect the RFID inlay stock, and/or to provide usable form factors and surface properties (e.g. printability, adhesive anchorage, weatherability, cushioning, etc.) for specific applications. For example, a suitable top web or facestock layer for carrying printing, such as the facestock 103 shown in FIG. 1, may be utilized. Suitable materials for the facestock include, but are not limited to, metal foils, polymer films, paper, and combinations thereof. The materials can be textiles including woven and non-woven fabrics made of natural or synthetic fibers. The materials can be single-layered paper or film or they can be multi-layered constructions. The multi-layered constructions or multi-layered polymeric films can have two or more layers, which can be joined by coextrusion, lamination, or other processes. The layers of such multi-layered constructions or multi-layered polymeric films can have the same composition and/or size or can have different compositions or sizes.

Figure 15:
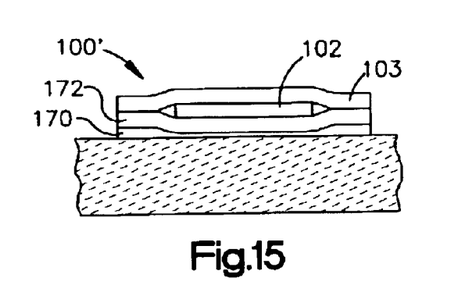
FIG. 15 is a side sectional view of an RFID label that includes an RFID inlay in accordance with the present invention.

As shown in FIG. 15, the inlay 102 may be part of an RFID label 100' that is adhesively adhered to the object. Besides the facestock 103, the RFID label 100' has an adhesive layer 170 for adhering it to the object 101. In addition, the label 100' may have a protective layer 172 between the inlay 102 and the adhesive layer 170. The RFID label 100' may also have other layers, such as adhesive layers coupling the facestock 103 to the inlay 102 and/or to the protective layer 172.

A wide variety of suitable adhesives may be used for the various parts of the RFID label 100'. For example, a suitable general-purpose, permanent pressure sensitive adhesive or a laminating adhesive may be utilized. A wide variety of permanent pressure sensitive adhesives are well known in the art. The pressure sensitive adhesive may be one of any number of different types of adhesives, such as acrylic and elastomeric pressure sensitive adhesives. If the facestock 103 is to be printed in a printer that generates high heat, such as a laser printer, the adhesives may be made to be temperature stable, such as is disclosed in Avery Dennison's U.S. Pat. No. 4,898,323, incorporated herein by this reference.

As a further alternative, a water activated adhesive, a heat activated adhesive, other types of adhesives known in the art may be used in adhering the RFID label 100' to the object. A bottom adhesive layer may be a printable material, such as paper or a coated polymer, for use in situations where a user wishes to print both the front and the back of the label in a printer. The adhesive surface of the label may include adhesive covering the entire bottom of the label, or may be coated in a pattern, as is known in the art. The adhesive may be of the sort that is removable so that the label may be removed from the substrate after it is applied thereto, or the adhesive may be a permanent type of adhesive for permanently bonding the label to the substrate. Alternatively, the adhesive may be repositionable, so that the label may be repositioned on the substrate after it is initially applied.

Figure 16:
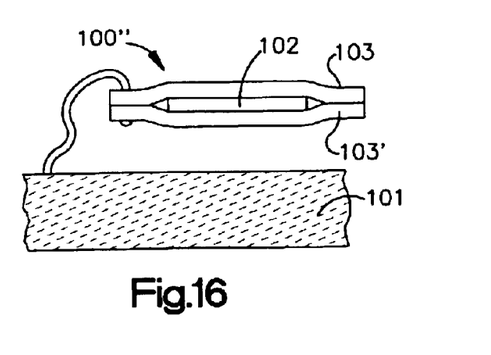
FIG. 16 is a side sectional view of an RFID tag that includes an RFID inlay in accordance with the present invention.

It will be appreciated that non-adhesive means may alternatively be used to secure an RFID tag 100" to an object 101, as is illustrated in FIG. 16. In the case of a dual sided tag used, for example, on clothing, a hole may be punched in one end of the tag 100", and a plastic fastener, string or other fastening means is inserted through the hole. The RFID tag 100" may have facestocks 103 and 103' on both sides of the RFID inlay 102, for instance to allow both sides of the RFID tag 100" to be printed.

Layers of the label or tag may be bonded together by means other than adhesive. For example, the integrated circuit may be held in place with a hot melt resin or other substance, which could also serve as a bonding agent. The resin could then take the place of an adhesive layer. Layers may also be bonded together by, for example, ultrasonic welding.

Alternatively, the label may have no adhesive on the underside whatsoever, as to when the label (or tag) is to be attached to the substrate by other means, which could include sewing, welding, heat bonding, or any other affixing method known in the tag or label art.

Methods of Fabrication

As stated above, the RFID inlay 102 may be assembled using a roll-to-roll process. That is, the inputs to the process may include large rolls of materials of the various layers and structures of at least some of the RFID inlay 102. Following are exampled of some methods that may be used in fabrication of the RFID tags or labels described above.

Figure 17:
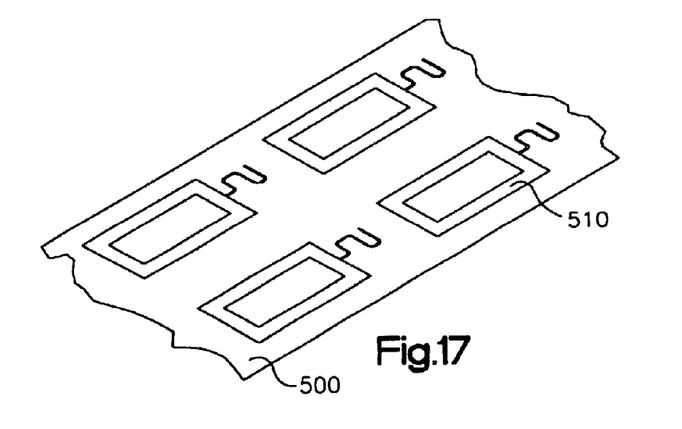
FIGS. 17 and 18 are isometric views illustrating various steps of a method of fabricating an RFID inlay in accordance with the present invention.
Figure 18:
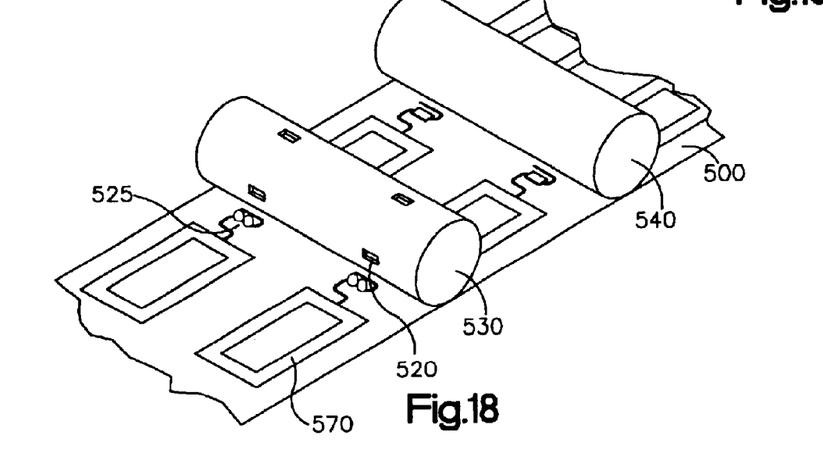

FIG. 17 illustrates a web 500 of RFID inlay substrate material onto which antennas 510 are printed or otherwise formed. Once antennas are on the web, individual straps 520 are affixed to the antennas, as FIG. 18 illustrates. In one approach, the straps 520 are held against an anvil 530 by a vacuum. The straps 520 are deposited onto appropriate contact portions 525 for the antennas 510.

As described above, the straps of the straps 520 may be affixed to the antennas 510 by means of an adhesive such as a conductive adhesive. The adhesive may be cured with UV radiation, heat, and/or pressure, as appropriate, as indicated at 540.

Figure 19:
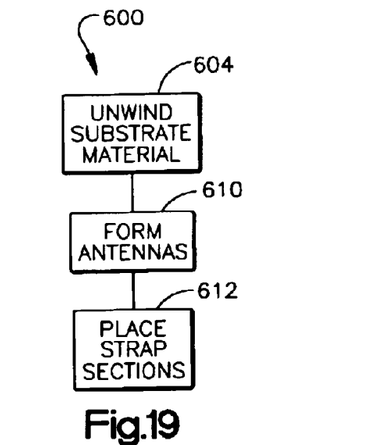
FIG. 19 is a high level flow chart illustrating various steps of a method of fabricating an RFID inlay in accordance with the present invention.

FIG. 19 is a high-level block diagram illustrating steps in a method 600 of manufacturing RFID inlays using such rolls. At step 604, a roll of the RFID inlay substrate material is unwound for printing. At step 610 antennas are printed or otherwise formed on the RFID inlay substrate material at a pitch corresponding to the desired pitch of the labels. Then, at step 612 the straps bearing the RFID chips are placed on in contact with the antennas. Finally, individual inlays are cut or separated from the web at step 616. The cutting may be accomplished by die cutting or by other cutting methods in the art, such as laser cutting, perforating, slitting, punching, or other known means that can scribe to specific shapes and sizes.

As an alternative to the foregoing methods of placing the straps bearing RFID chips, the straps may be placed using a pick-and-place operation. The straps may be formed on a web or sheet of strap substrate material, and separated from the web or sheet, such as by cutting. The straps may then be integrated into an RFID inlay stock using a pick-and-place operation.

The pick and place operation may be performed by a pick and place device, which may include mechanical and/or vacuum grips to grip a strap bearing a small electronic block while moving it into the desired location in alignment with the label. It will be appreciated that a wide variety of suitable pick and place devices are well known. Examples of such devices are the devices disclosed in U.S. Pat. Nos. 6,145, 901, and 5,564,888, both of which are incorporated herein by reference, as well as the prior art devices that are discussed in those patents.

Alternatively, rotary placers may be utilized to place the straps upon the labels. An example of such a device is disclosed in U.S. Pat. No. 5,153,983, the disclosure of which is incorporated herein by reference.

The integrated circuits or RFID chips may be friction fitted in recesses in the RFID microelectronic stock, or they may be secured therein by the use of adhesives and/or solder. Electrical connection between the RFID chips and circuitry to be connected to the antennas may be done with wire bonding, ribbon bonding, tape-automated bonding, lead frames, flip chip bonding, and/or conductive gluing of leads.

In one embodiment of the invention, shown in FIG. 11 and described above, the initial step in manufacturing an RFID inlay involves forming receptor wells or holes in a polymeric film substrate, herein sometimes called a "receptor film". In such an embodiment, the polymeric film substrate is a material selected from a class of polymeric films described in commonly-assigned U.S. patent application Ser. No. 09/776,281, filed Feb. 2, 2001, entitled "Method of Making a Flexible Substrate Containing Self-assembling Microstructures." The receptor holes are formed in this substrate film using the precision continuous embossing process disclosed in the '281 patent application. These polymeric materials, and the preferred process for forming receptor wells, are described below. Alternatively, the polymeric film substrate may be selected from the polymeric materials described in Alien Technology Corporation's patent applications, such as PCT International Publication WO 00/55916. Alternative techniques for forming microstructure receptor wells or holes in the polymer film substrate, as described in Alien's patent publications, include for example stamping and injection molding.

The polymer film includes wells that are filled with tiny electronic component chips via a Fluidic Self-Assembly (FSA) process, such as that developed by Alien Technology Corporation of Morgan Hill, Calif. Then, a planarizing layer is coated on top of the filled wells. The purpose of the planarization is to fill any gaps that still may be present; to provide a smooth, flat surface for later processes, such as the etching of vias; to assure that the microelectronic block elements (i.e. chips) are maintained in position in their recesses on the substrate during further processing steps; and to provide mechanical integrity for the laminate. "Vias" are then created with etching techniques. The vias are then coated with aluminum to form a pair of pads on opposite sides of the chip for electronic connection. The polymeric film web at this stage of the process, with embedded chips and associated pads, is referred to in the present application as an "RFID webstock" (or in the case of a sheet substrate, "RFID sheetstock").

The fabrication process for making the RFID inlays with conductive traces may include the steps above for forming an antenna on an inlay substrate material, and attaching a strap to the inlay substrate and antenna. Thereafter the conductive traces may be deposited on the RFID inlay to couple the strap leads and the antenna. As noted above, the conductive traces may be formed by printing of conductive ink. The printing may include any of a variety of suitable printing techniques, such as screen printing, ink jet printing, or Gravure printing. It will be appreciated that other suitable methods may be used to form the conductive traces. For example, vapor deposition methods or methods such as sputtering may be utilized.

Articles according to the present invention may be, for example, a luggage label or tag, a laundry label or tag, a label or tag for cataloging library articles, a label or tag for identifying an apparel product, a label or tag for identifying a postal article, a label or tag for identifying a medical article, or a label or tag for a transportation ticket.

Another alternative is to provide a label or tag having more than one RFID chip. The RFID chips may be arranged in a row, column or matrix, and may be electrically interconnected with one another.

As another alternative, a label or tag may include electrical and/or electronic components other than RFID chips. For instance, an RFID label or tag may include a sensor, a MEMS, or other type of component. The components may be electrically interconnected to form a circuit. The type of electrical and/or electronic components to be used can be selected by one of ordinary skill in the art and depends on the use of the label or tag.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A radio frequency identification (RFID) inlay comprising:
    an inlay substrate;
    an antenna on the inlay substrate;
    a strap, wherein the strap includes:
        an RFID chip having contacts thereupon; and
        strap leads operatively coupled to the contacts of the chip;
    a nonconductive adhesive attaching the strap to the inlay substrate; and
    a conductive connection operatively coupling the strap leads and the antenna;
    wherein the conductive connection includes conductive bumps attached to the strap.

2. The RFID inlay of claim 1, wherein the conductive bumps are attached to the strap leads.

3. The RFID inlay of claim 2, wherein the conductive bumps are electroplated onto the strap leads.

4. The RFID inlay of claim 1, wherein the conductive bumps each include a plurality of hard particles.

5. The RFID inlay of claim 4, wherein the hard particles include diamond particles.

6. The RFID inlay of claim 1, wherein the conductive bumps include at least one metal.

7. The RFID inlay of claim 6, wherein the at least one metal is a metal selected from a group consisting of gold, nickel, and palladium.

8. The RFID inlay of claim 1, wherein the conductive bumps include a plurality of sharp points in contact with the antenna.

9. The RFID inlay of claim 8, wherein the non-conductive adhesive is between the conductive bumps and the antenna, with at least some of the sharp points protruding through the non-conductive adhesive to contact the antenna.

10. The RFID inlay of claim 8, wherein the sharp points are produced by a plurality of hard particles in the conductive bumps.

11. The RFID inlay of claim 10, wherein the hard particles include diamond particles.

12. The RFID inlay of claim 8, wherein the conductive bumps have a height of 5 to 25 microns.

13. The RFID inlay of claim 1, in combination with a facestock to which the inlay is attached.

14. The combination of claim 13, wherein the facestock is a printable facestock.

15. The combination of claim 13, as part of an RFID label.

16. The combination of claim 13, as part of an RFID tag.

17. A radio frequency identification (RFID) inlay comprising:
    an inlay substrate;
    an antenna on the inlay substrate;
    a strap, wherein the strap includes:
        an RFID chip having contacts thereupon; and
        strap leads operatively coupled to the contacts of the chip;
    a nonconductive adhesive attaching the strap to the inlay substrate; and
    a conductive connection operatively coupling the strap leads and the antenna;
    wherein the strap includes a strap substrate to which the strap leads are attached.

18. The RFID inlay of claim 17, wherein the conductive connection is in contact with the strap leads and in contact with the antenna.

19. The RFID inlay of claim 17, wherein the conductive connection includes conductive traces in contact with the strap leads and the antenna.

20. The RFID inlay of claim 19, wherein the conductive traces include conductive ink traces.

21. The RFID inlay of claim 20, wherein the conductive ink includes metal particles.

22. The RFID inlay of claim 21, wherein the metal particles include silver particles.

23. The RFID inlay of claim 19, wherein the conductive connection also includes conductive bumps attached to the strap.

24. The RFID inlay of claim 23, wherein the conductive bumps each include a plurality of hard particles.

25. The RFID inlay of claim 24, wherein the hard particles include diamond particles.

26. The RFID inlay of claim 19, wherein the nonconductive adhesive is in contact with the strap leads and is in contact with the antenna, and is between the strap leads and the antenna.

27. The RFID inlay of claim 17, wherein the nonconductive adhesive also attaches the strap to the antenna.

28. The RFID inlay of claim 17, wherein the nonconductive adhesive attaches the strap substrate to the inlay substrate.

29. The RFID inlay of claim 28, wherein an additional adhesive attaches the strap leads to the antenna.

30. The RFID inlay of claim 29, wherein the additional adhesive is conductive.

31. The RFID inlay of claim 29, wherein the additional adhesive is nonconductive.

32. The RFID inlay of claim 17, wherein the strap substrate includes a polymer material.

33. The RFID inlay of claim 17, wherein the inlay substrate includes a polymer material.

34. The RFID inlay of claim 17, in combination with a facestock to which the inlay is attached.

35. The combination of claim 34, wherein the facestock is a printable facestock.

36. The combination of claim 34, as part of an RFID label.

37. The combination of claim 34, as part of an RFID tag.

38. The RFID inlay of claim 17, wherein the strap substrate overlies and is attached to a portion of the antenna.

39. A radio frequency identification (RFID) inlay comprising:
an inlay substrate;
an antenna on the inlay substrate;
a strap attached to the antenna and the inlay substrate, wherein the strap includes:
an RFID chip having contacts thereupon; and
strap leads operatively coupled to the contacts of the chip; and
conductive bumps attached to the strap and in contact with the antenna;
wherein the conductive bumps electrically couple the strap leads and the antenna.

40. The RFID inlay of claim 39, wherein the conductive bumps are attached to the strap leads.

41. The RFID inlay of claim 40, wherein the conductive bumps are electroplated onto the strap leads.

42. The RFID inlay of claim 39, wherein the conductive bumps each include a plurality of hard particles.

43. The RFID inlay of claim 42, wherein the hard particles include diamond particles.

44. The RFID inlay of claim 39, wherein the conductive bumps include at least one metal.

45. The RFID inlay of claim 44, wherein the at least one metal is a metal selected from a group consisting of gold, nickel, and palladium.

46. The RFID inlay of claim 39, wherein the conductive bumps include a plurality of sharp points in contact with the antenna.

47. The RFID inlay of claim 46, wherein an adhesive is between the conductive bumps and the antenna, with at least some of the sharp points protruding through the adhesive to contact the antenna.

48. The RFID inlay of claim 47, wherein the adhesive is a nonconductive adhesive.

49. The RFID inlay of claim 47, wherein the adhesive is a conductive adhesive.

50. The RFID inlay of claim 46, wherein the sharp points are produced by a plurality of hard particles in the conductive bumps.

51. The RFID inlay of claim 50, wherein the hard particles include diamond particles.

52. The RFID inlay of claim 39, wherein the conductive bumps have a height of 5 to 25 microns.

53. The RFID inlay of claim 39, further comprising conductive traces in contact with the strap leads and the antenna.

54. The RFID inlay of claim 53, wherein the conductive traces include conductive ink traces.

55. The RFID inlay of claim 54, wherein the conductive ink includes metal particles.

56. The RFID inlay of claim 55, wherein the metal particles include silver particles.

57. The RFID inlay of claim 39, wherein the strap includes a strap substrate to which the strap leads are attached.

58. The RFID inlay of claim 57, wherein a nonconductive adhesive attaches the strap substrate to the inlay substrate.

59. The RFID inlay of claim 57, wherein the conductive bumps protrude further from the strap leads than does the strap substrate.

60. The RFID inlay of claim 57, wherein the strap substrate includes a polymer material.

61. The RFID inlay of claim 57, wherein the strap substrate overlies and is attached to a portion of the antenna.

62. The RFID inlay of claim 39, wherein the inlay substrate includes a polymer material.

63. The RFID inlay of claim 39, wherein the strap is within a depression in the inlay substrate.

64. The RFID inlay of claim 39, in combination with a facestock to which the inlay is attached.

65. The combination of claim 64, wherein the facestock is a printable facestock.

66. The combination of claim 64, as part of an RFID label.

67. The combination of claim 64, as part of an RFID tag.

68. A radio frequency identification (RFID) inlay comprising:
an inlay substrate;
an antenna on the inlay substrate;
a strap attached to the antenna and the substrate, wherein the strap includes:
an RFID chip having contacts thereupon;
strap leads operatively coupled to the contacts of the chip; and
a strap substrate to which the strap leads are attached; and
conductive traces overlying and in contact with both the antenna and the strap leads;
wherein the strap substrate overlies and is attached to a portion of the antenna.

69. The RFID inlay of claim 68, wherein the conductive traces include conductive ink traces.

70. The RFID inlay of claim 69, wherein the conductive ink includes metal particles.

71. The RFID inlay of claim 70, wherein the metal particles include silver particles.

72. The RFID inlay of claim 68, further comprising conductive material between the strap leads and the antenna.

73. The RFID inlay of claim 72, wherein the conductive material includes a conductive adhesive.

74. The RFID inlay of claim 72, wherein the conductive material includes conductive bumps attached to the strap leads.

75. The RFID inlay of claim 74, wherein the conductive bumps have a height of 5 to 25 microns.

76. The RFID inlay of claim 68, wherein the strap substrate includes a polymer material.

77. The RFID inlay of claim 68, wherein the inlay substrate includes a polymer material.

78. The RFID inlay of claim 68, wherein the strap is ultrasonically welded to the antenna.

79. The RFID inlay of claim 68, wherein the strap is adhesively attached to the antenna.

80. The RFID inlay of claim 68, in combination with a facestock to which the inlay is attached.

81. The combination of claim 80, wherein the facestock is a printable facestock.

82. The combination of claim 80, as part of an RFID label.

83. The combination of claim 80, as part of an RFID tag.

* * * * *